(12) United States Patent
Chen et al.

(10) Patent No.: US 11,984,444 B2
(45) Date of Patent: May 14, 2024

(54) SEMICONDUCTOR DEVICE AND METHOD OF MANUFACTURING THE SAME

(71) Applicant: TAIWAN SEMICONDUCTOR MANUFACTURING COMPANY LTD., Hsinchu (TW)

(72) Inventors: Chung-Hui Chen, Hsinchu (TW); Wan-Te Chen, Taipei County (TW); Tzu Ching Chang, Taichung County (TW); Tsung-Hsin Yu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 132 days.

(21) Appl. No.: 17/357,818

(22) Filed: Jun. 24, 2021

(65) Prior Publication Data

US 2022/0278092 A1 Sep. 1, 2022

Related U.S. Application Data

(60) Provisional application No. 63/154,056, filed on Feb. 26, 2021.

(51) Int. Cl.
*H01L 27/06* (2006.01)
*H01L 21/8234* (2006.01)
*H01L 23/522* (2006.01)

(52) U.S. Cl.
CPC .. *H01L 27/0629* (2013.01); *H01L 21/823475* (2013.01); *H01L 23/5222* (2013.01)

(58) Field of Classification Search
CPC ......... H01L 27/0629; H01L 21/823475; H01L 23/5222; H01L 27/0733; H01L 29/7851; H01L 29/7855–7856; H01L 21/823431; H01L 21/823821; H01L 21/845; H01L 27/0886; H01L 27/0924; H01L 27/1211; H01L 29/41791; H01L 29/66795–66818; H01L 29/785–7856; H01L 2029/7857–7858; H01L 2924/13067; H01L 29/04–045; H01L 29/16–1608; H01L 29/18–185; H01L 29/22–2206;
(Continued)

(56) References Cited

U.S. PATENT DOCUMENTS 9,455,250 B1 * 9/2016 Cheng ................ H01L 27/0207
10,109,720 B1 * 10/2018 Yin ..................... H01L 29/4238
(Continued)

*Primary Examiner* — Eric A. Ward
*Assistant Examiner* — Nora Taylor Nix
(74) *Attorney, Agent, or Firm* — WPAT LAW; Anthony King

(57) ABSTRACT

A semiconductor device and method of manufacturing the same are provided. The semiconductor device includes a first active region extending along a first direction. The semiconductor device also includes a second active region extending along the first direction. The semiconductor device further includes a first gate extending along a second direction perpendicular to the first direction. The first gate has a first segment disposed between the first active region and the second active region. In addition, the semiconductor device includes a first electrical conductor extending along the second direction and across the first active region and the second active region, wherein the first segment of the first gate and the first electrical conductor are partially overlapped to form a first capacitor.

20 Claims, 9 Drawing Sheets

(58) Field of Classification Search
CPC ......... H01L 29/36–365; H01L 29/7853–7854; H01L 27/10826; H01L 27/10879; H10B 12/36; H10B 12/056
See application file for complete search history.

(56) References Cited

U.S. PATENT DOCUMENTS

| | | | |
|---|---|---|---|
| 10,475,791 B1* | 11/2019 | Zang | H01L 29/7853 |
| 10,515,947 B2 | 12/2019 | Chen et al. | |
| 2013/0200449 A1* | 8/2013 | Chen | H01L 27/1211 |
| | | | 257/E21.409 |
| 2016/0148832 A1* | 5/2016 | Leobandung | H01L 29/6656 |
| | | | 438/283 |
| 2016/0197071 A1* | 7/2016 | Yeh | H01L 23/485 |
| | | | 438/396 |
| 2016/0307837 A1* | 10/2016 | Park | H01L 23/485 |
| 2018/0174953 A1* | 6/2018 | Nam | H01L 27/0886 |
| 2019/0006458 A1* | 1/2019 | Chan | H01L 21/76224 |
| 2019/0115437 A1* | 4/2019 | Galatage | H01L 29/40114 |
| 2020/0227267 A1* | 7/2020 | Baykan | H01L 29/785 |
| 2020/0357896 A1* | 11/2020 | Cheng | H01L 27/0886 |
| 2022/0344461 A1* | 10/2022 | Jung | H01L 29/785 |

\* cited by examiner

SEMICONDUCTOR DEVICE AND METHOD OF MANUFACTURING THE SAME

CROSS REFERENCE TO RELATED APPLICATIONS

This application claims the benefit of U.S. Provisional Application No. 63/154,056, filed on Feb. 26, 2021, the disclosure of which is hereby incorporated by reference in its entirety.

BACKGROUND

When a semiconductor device such as a metal-oxide-semiconductor field-effect transistor (MOSFET) is scaled down through various technology nodes, device packing density and device performance can be compromised by device layout and isolation. In order to avoid leakage between neighboring devices (cells), the gates may be isolated from each other by a poly cut layer.

As the semiconductor IC industry has evolved into the use of nanometer technology nodes in pursuit of increased device density, higher performance, and lower costs, challenges of both fabrication and design have resulted in the development of three-dimensional (3D) devices. However, the three-dimensional devices and methods of fabricating three-dimensional devices have not been entirely satisfactory in adopting the poly cut layer for isolating neighboring devices (cells).

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
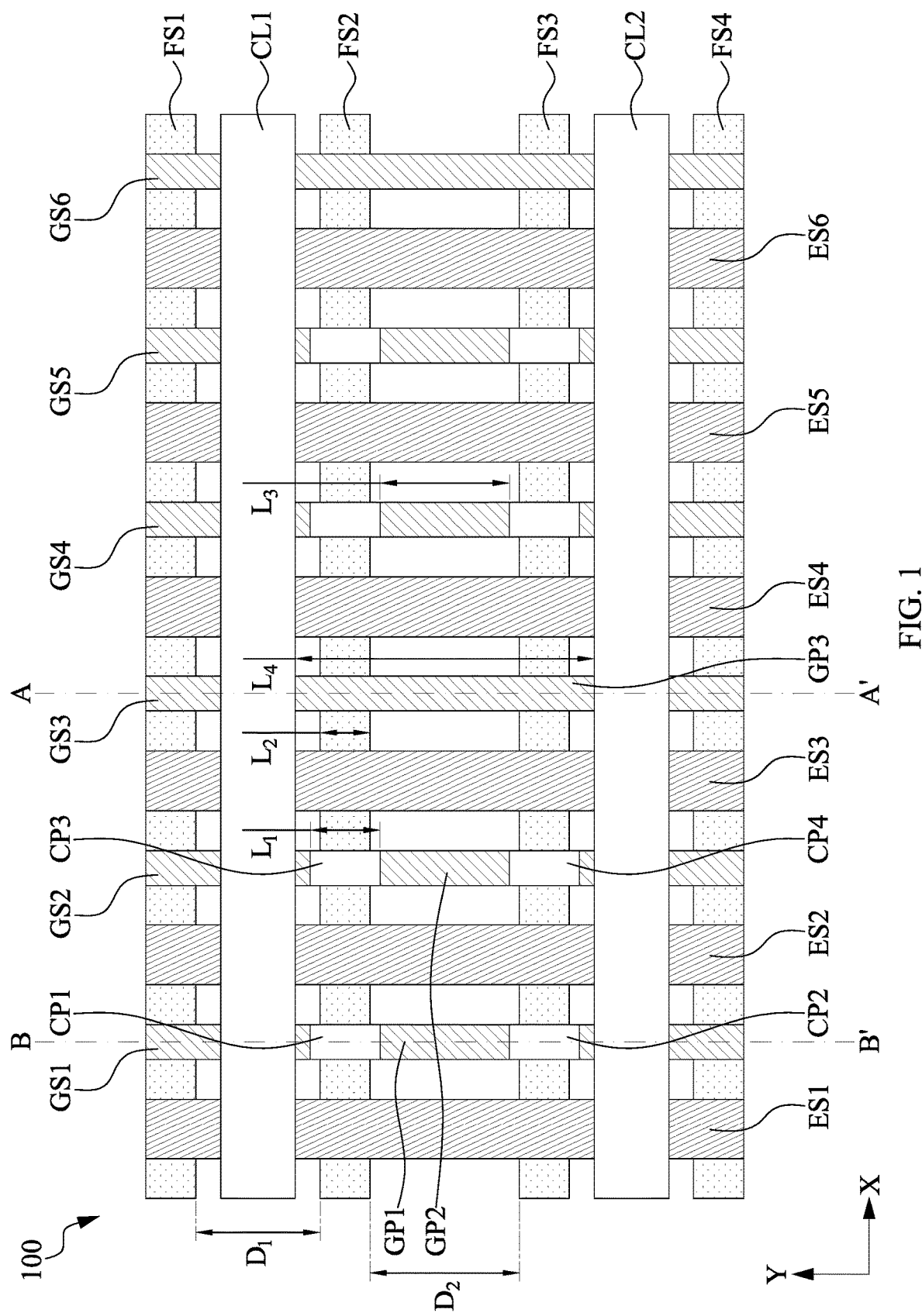
FIG. 1 illustrates a schematic view of a layout of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 illustrates a schematic view of a layout of a semiconductor device 100, in accordance with some embodiments of the present disclosure.

In some embodiments, the semiconductor device 100 includes a plurality of active regions FS1, FS2, FS3 and FS4, a plurality of gates GS1, GS2, GS3, GS4, GS5 and GS6 and a plurality of electrical conductors ES1, ES2, ES3, ES4, ES5 and ES6. The numbers of the active regions, the gates, and the electrical conductors are given for illustrative purposes. Various numbers of the active regions, the gates, and the electrical conductors are within the contemplated scope of the present disclosure. The terms "comprise" or "comprising," "include" or "including," "have" or "having," and the like used in this application are to be understood to be open-ended, i.e., to mean including but not limited to. Accordingly, various elements and/or structures, which are not shown in FIG. 1 and formed in the semiconductor device 100, are within the contemplated scope of the present disclosure.

In some embodiments, as shown in FIG. 1, the active regions FS1-FS4 extend along the X direction. The active regions FS1-FS4 are parallel to each other along the Y direction. The active regions FS1-FS4 are spaced apart from each other. In some embodiments, two adjacent active regions FS1-FS4 may have different distances between them. For example, the active region FS1 and the active region FS2 may have a distance $D_1$ between them, and the active region FS2 and the active region FS3 may have a distance $D_2$ between them. The distance $D_2$ is greater than the distance $D_1$. In some embodiments, each one of the active regions FS1-FS4 includes one or more fin structures for forming, for example, Fin Field-Effect Transistor (FinFET). In various embodiments, at least one fin structure is formed on, or formed with, each one of the active regions FS1-FS4. In other some embodiments, each one of the active regions FS1-FS4 may include one or more nanosheet structures. In some embodiments, the term "active region" discussed in the present disclosure may be also referred to as "OD" (oxide dimensioned area).

In some embodiments, the active regions FS1-FS4 are formed over an insulating layer (not shown). In some embodiments, the active regions FS1-FS4 are formed by using semiconductor material. In some other embodiments, the active regions FS1-FS4 are formed by using silicon on insulator (SOI) technology. In some alternative embodiments, the active regions FS1-FS4 are patterned from an epitaxial layer of semiconductor material.

In some embodiments, as shown in FIG. 1, the gates GS1-GS6 extend along the Y direction. The gates GS1-GS6 are parallel to each other along the X direction. The gates GS1-GS6 are spaced apart from each other. In some embodiments, the gates GS1-GS6 cross over the active regions FS1-FS4 to form transistors (e.g., FinFETs). In some embodiments, the gates GS1-GS6 at least partially cross over the active regions FS1-FS4. In some embodiments, the gate GS1 overlaps the active region FS1. In some embodiments, the gate GS1 overlaps the active region FS4. In some embodiments, the gate GS1 is free from overlapping the active region FS2, In some embodiments, the gate GS1 is free from overlapping the active region FS3. In some embodiments, the gate GS3 overlaps the active regions FS1-FS4. In some embodiments, the gates GS1-GS6 are substantially perpendicular to the active regions FS1-FS4 in a plan view or in the Z direction. In some embodiments, the term "gate" discussed in the present disclosure is also referred to as "PO."

The terms "overlap" and "overlapping" in this disclosure are used to describe that two elements and/or features are at least partially aligned to each other in or along the X direction, the Y direction, or the Z direction.

Each one of the active regions FS1-FS4 has a source region and a drain region. One source region and one drain region are formed at two opposite sides of each one of the gates GS1-GS6. In some embodiments, the source regions and the drain regions are located at respective two sides of channel regions that are formed beneath the gates GS1-GS6. In some embodiments, the source regions and the drain regions are source doped regions and drain doped regions, respectively. In some embodiments, the source regions and the drain regions of the active regions FS1-FS4 are uniformly doped.

In some embodiments, as shown in FIG. 1, the electrical conductors ES1-ES6 extend along the Y direction. The electrical conductors ES1-ES6 are parallel to each other along the X direction. The electrical conductors ES1-ES6 are spaced apart from each other. In some embodiments, the electrical conductors ES1-ES6 cross over the active regions FS1-FS4. In some embodiments, the electrical conductors ES1-ES6 are substantially perpendicular to the active regions FS1-FS4 in a plan view. In some embodiments, the electrical conductors ES1-ES6 and the gates GS1-GS6 may be arranged alternatively along the X direction. For example, one of the electrical conductors ES1-ES6 is disposed between two adjacent gates GS1-GS6. For example, the electrical conductor ES2 is disposed between the gate GS1 and the gate GS2. In some embodiments, the pattern of the electrical conductors ES1-ES6 are arranged as source/drain (S/D) contacts that are electrically connected to the source regions and/or the drain regions. In some embodiments, the term "electrical conductor" discussed in the present disclosure is also referred to as "MD."

In some embodiments, the semiconductor device 100 further includes cutting structures CL1 and CL2. The cutting structures CL1 and CL2 extend along the X direction. In some embodiments, the cutting structure CL1 is formed between the active region FS1 and the active region FS2, and the cutting structure CL2 is formed between the active region FS3 and the active region FS4. Each of the cutting structures CL1 and CL2 may be free from overlapping the active regions FS1-FS4. Each one of the cutting structures CL1 and CL2 extends continuously and across the gates GS1-GS6 and the electrical conductors ES1-ES6. The cutting structures CL1 and CL2 are configured to disconnect the gates GS1-GS6, and disconnect the electrical conductors ES1-ES6 to avoid leakage between neighboring devices (cells). Dielectric material(s) may fill the cutting structures CL1 and CL2. In some embodiments, the cutting structures CL1 and CL2 are implemented in a poly cut layer (also referred to as "CPO" or "cutting structure" in some embodiments).

In some embodiments, the gate GS1 may define a gap CP1 and a gap CP2. In some embodiments, the gap CP1 may overlap the active region FS2. In some embodiments, the gap CP2 may overlap the active region FS3. The gaps CP1 and CP2 are configured to physically disconnect the gate GS1 such that the gate GS1 may be free from overlapping the active region FS2 and the active region FS3. The gap CP1 has a length $L_1$ along the Y direction, and the active region FS2 has a length $L_2$ less than $L_1$ along the Y direction. In some embodiments, the gate GS1 may include a plurality of segments spaced apart from each other. These segments may be separated from each other by the cutting structures CL1, CL2, the gaps CP1, CP2 and/or other features (not shown). In some embodiments, the gate GS1 may include a segment GP1 continuously extending between the gap CP1 and the gap CP2. The segment GP1 has a length $L_3$ along the Y direction. In some embodiments, the length $L_3$ is less than the distance $D_2$.

In some embodiments, the gate GS2 may define a gap CP3 and a gap CP4. In some embodiments, the gap CP3 is aligned to the gap CP1 in the X direction, and the gap CP4 is aligned to the gap CP2 in the X direction. In some embodiments, the gate GS2 may include a plurality of segments spaced apart from each other. These segments may be separated from each other by the cutting structures CL3, CL4, the gaps CP3, CP4 and/or other features (not shown). In some embodiments, the gate GS2 may include a segment GP2 continuously extending between the gap CP3 and the gap CP4. In some embodiments, the segment GP1 is aligned to segment GP2 in the X direction and have substantially the same lengths along the Y direction. In some embodiments, the gaps CP1-CP4 are implemented in a cut poly on OD edge layer (also referred to as "CPODE" or "electrically isolating structure" in some embodiments).

In some embodiments, the gate GS3 may include a plurality of segments spaced apart from each other. These segments may be separated from each other by the cutting structures CL1, CL2 and/or other features (not shown). In some embodiments, the gate GS3 may include a segment GP3 continuously extending between the cutting structures CL1 and CL2. In some embodiments, the segment GP3 overlaps the active regions FS2 and FS3. In some embodiments, the segment GP3 has a length L4 greater than $L_3$ of the segment GP1 along the Y direction.

Figure 2A:
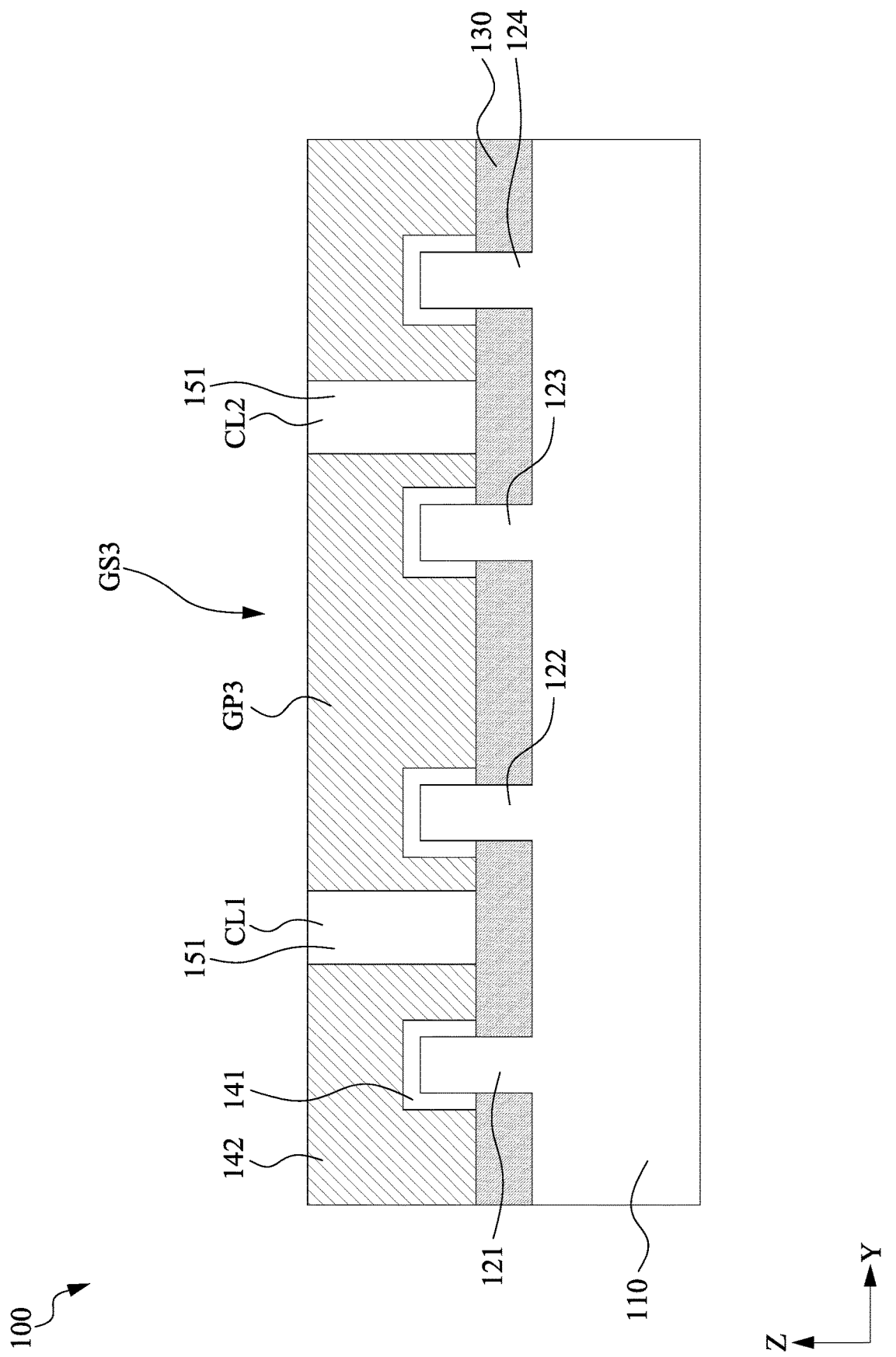
FIG. 2A illustrates a cross-sectional view of a semiconductor device, in accordance with some embodiments of the present disclosure.

FIG. 2A illustrates a cross-sectional view along line A-A' of the semiconductor device 100 as shown in FIG. 1, in accordance with some embodiments of the present disclosure.

In some embodiments, the semiconductor device 100 includes a substrate 110, a plurality of fins 121, 122, 123 and 124, an isolation structure 130, gate dielectric layer(s) 141, a gate electrode layer 142 and dielectric layer(s) 151.

The substrate 110 may be a semiconductor substrate, such as a bulk semiconductor, a semiconductor-on-insulator (SOI) substrate, or the like, which may be doped (e.g., with a p-type or an n-type dopant) or undoped. The substrate 110 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 110 may include a plurality of regions (not shown) for forming p-type devices and/or n-type devices, such as PMOS and/or transistors, e.g., p-type FinFETs and/or n-type FinFETs.

The fins 121-124 are formed on the substrate 110 and are spaced apart from each other. The fins 121-124 are semiconductor strips. In some embodiments, the fins 121-124 may protrude from the substrate 110 by etching trenches in the substrate 110. The etching may be any acceptable etch process, such as a reactive ion etch (RIE), neutral beam etch (NBE), the like, or a combination thereof. The etch process may be anisotropic. The fins 121-124 may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. In some embodiments, each of the fins 121-124 has a lower portion disposed in the substrate 110 and an upper portion protruding from the substrate 110. Each of the fins 121-124 may correspond to the active regions FS1-FS4 of FIG. 1, respectively.

The isolation structure 130 may be disposed on the substrate 110. The isolation structure 130 may be a shallow trench isolation (STI) structure surrounding the fins 121-124. A lower portion of each of the fins 121-124 is surrounded by the isolation structure 130, and an upper portion of each of the fins 121-124 protrudes from the isolation structure 130. The isolation structure 130 is configured to prevent electrical interference and crosstalk.

The gate (e.g., the gates GS1-GS6 as shown in FIG. 1) may include the gate dielectric layer 141 and the gate electrode layer 142. The gate dielectric layer 141 may be conformally disposed on the upper portion of the fins 121-124. The gate dielectric layer 141 may be a single layer or multiple layers. The gate dielectric layer 141 may include silicon oxide ($SiO_x$), silicon nitride ($Si_xN_y$), silicon oxynitride (SiON), or a combination thereof. In some embodiments, the gate dielectric layer 141 is deposited by a plasma enhanced chemical vapor deposition (PECVD) process or by a spin coating process. The gate dielectric layer 141 may include dielectric material(s), such as high-k dielectric material. The high-k dielectric material may have a dielectric constant (k value) greater than 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of the disclosure.

The gate electrode layer 142 is disposed on the gate dielectric layer 141. The gate electrode layer 142 is made of conductive material, such as aluminum (Al), copper (Cu), tungsten (W), titanium (Ti), tantalum (Ta), or other applicable materials. In some embodiments, the gate electrode layer 142 includes a work function layer. The work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof. Other suitable materials are within the contemplated scope of the disclosure.

In some embodiments, the cutting structure CL1 may be disposed between the fin 121 and the fin 122 to cut the gate GS3. In some embodiments, the cutting structure CL2 may be disposed between the fin 123 and the fin 124 to cut the gate GS3. Each one of the cutting structures CL1 and CL2 may include a dielectric layer 151. The dielectric layer 151 may include low-k dielectric materials that has a dielectric constant (k value) less than 4. Examples of low-k dielectric materials include, but are not limited to, fluorinated silica glass (FSG), carbon doped silicon oxide, amorphous fluorinated carbon, parylene, bis-benzocyclobutenes (BCB), carbon doped silicon oxide, amorphous fluorinated carbon, parylene, polytetrafluoroethylene (PTFE)(Teflon), or silicon oxycarbide polymers (SiOC). Other suitable materials are within the contemplated scope of the disclosure. In some embodiments, the dielectric layer 151 discussed in the present disclosure is also referred to as "cutting structure."

In some embodiments, the segment GP3 of the gate GS3 extends continuously from the cutting structure CL1 to the cutting structure CL2. The segment GP3 of the gate GS3 may be defined by the cutting structures CL1 and CL2. In some embodiments, the segment GP3 overlaps the fin 122 and the fin 123. In some embodiments, the segment GP3 is disposed over the fin 122, fin 123 and the isolation structure 130.

Figure 2B:
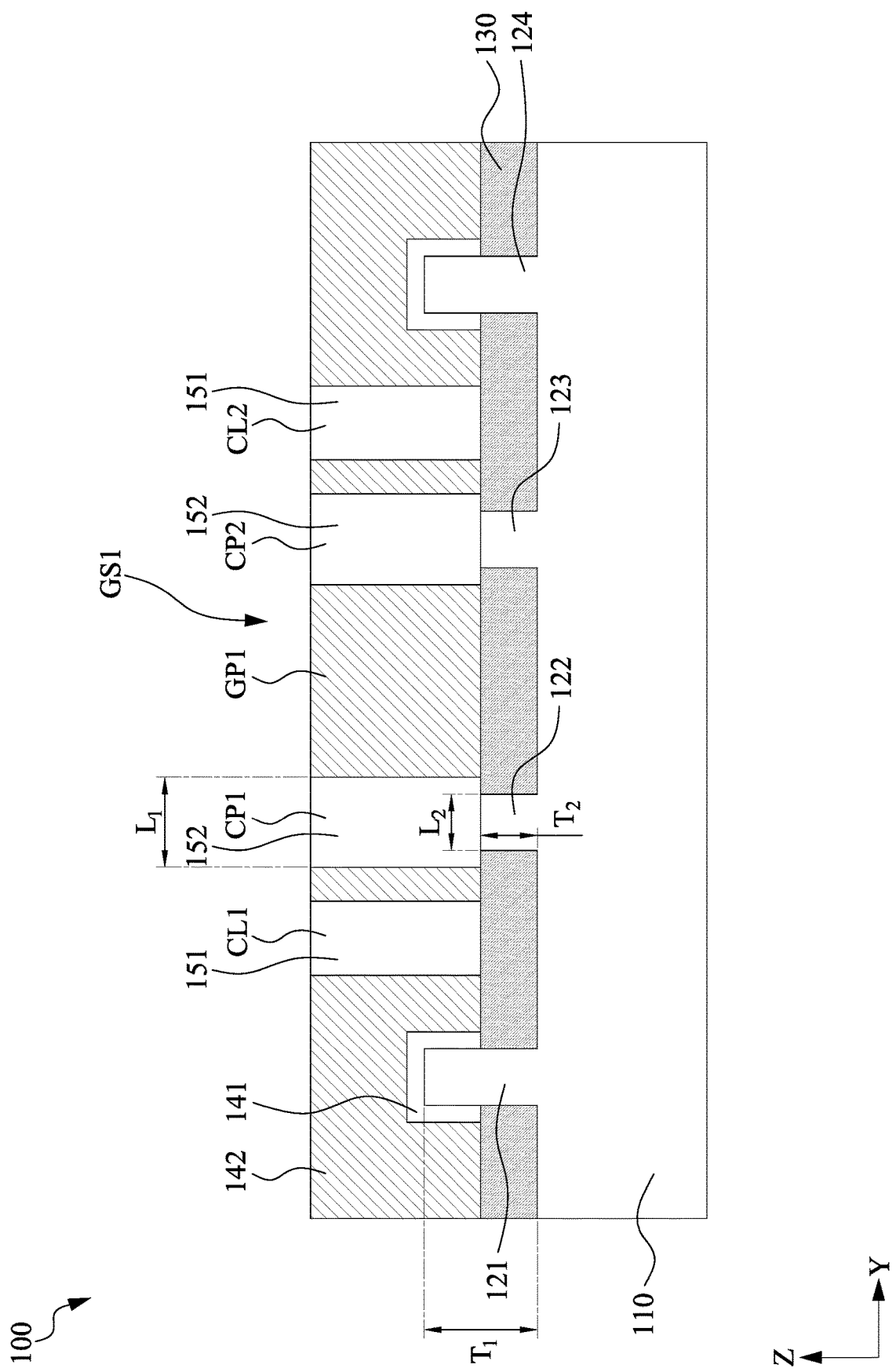
FIG. 2B illustrates a cross-sectional view of a semiconductor device, in accordance with some embodiments of the present disclosure.

FIG. 2B illustrates a cross-sectional view along line B-B' of the semiconductor device 100, in accordance with some embodiments of the present disclosure.

In some embodiments, the gap CP1 is located over the fin 122, and the gap CP2 is located over the fin 123 to cut the gate GS1. In some embodiments, each of the gap CP1 and the gap CP2 is disposed between the cutting structures CL1 and CL2. The gap CP1 and the gap CP2 may be filled with a dielectric layer 152. In some embodiments, the material of the dielectric layer 152 is the same as or similar to that of the dielectric layer 151. In some embodiments, the material of the dielectric layer 152 is different from that of the dielectric layer 151. In some embodiments, the upper portion of the fin 122 is cut such that the fin 122 has a thickness $T_2$ less than the thickness $T_1$ of the fin 121 in this cross-section. More specifically, the upper portion of the fin 122 is cut and replaced with the dielectric layer 152. Further, the length $L_1$ of the gap CP1 is greater the length $L_2$ of the fin 122 along the Y direction. In some embodiments, the dielectric layer 152 discussed in the present disclosure is also referred to as "electrically isolating structure" or "CPODE."

In some embodiments, the segment GP1 extends continuously from the gap CP1 to the gap CP2. The segment GP1 may be defined by the gap CP1 and the gap CP2. In some embodiments, the segment GP1 is disposed on or directly over the isolation structure 130. In some embodiments, the segment GP1 is free from vertically overlapping the fin 122. In some embodiments, the segment GP1 is free from vertically overlapping the fin 123. That is, the segment GP1 of the gate GS1 is physically spaced apart from the active region FS2 and active region FS3. The segment GP1 of the gate GS1 is electrically isolated from the active regions FS1-FS4.

Figure 3:
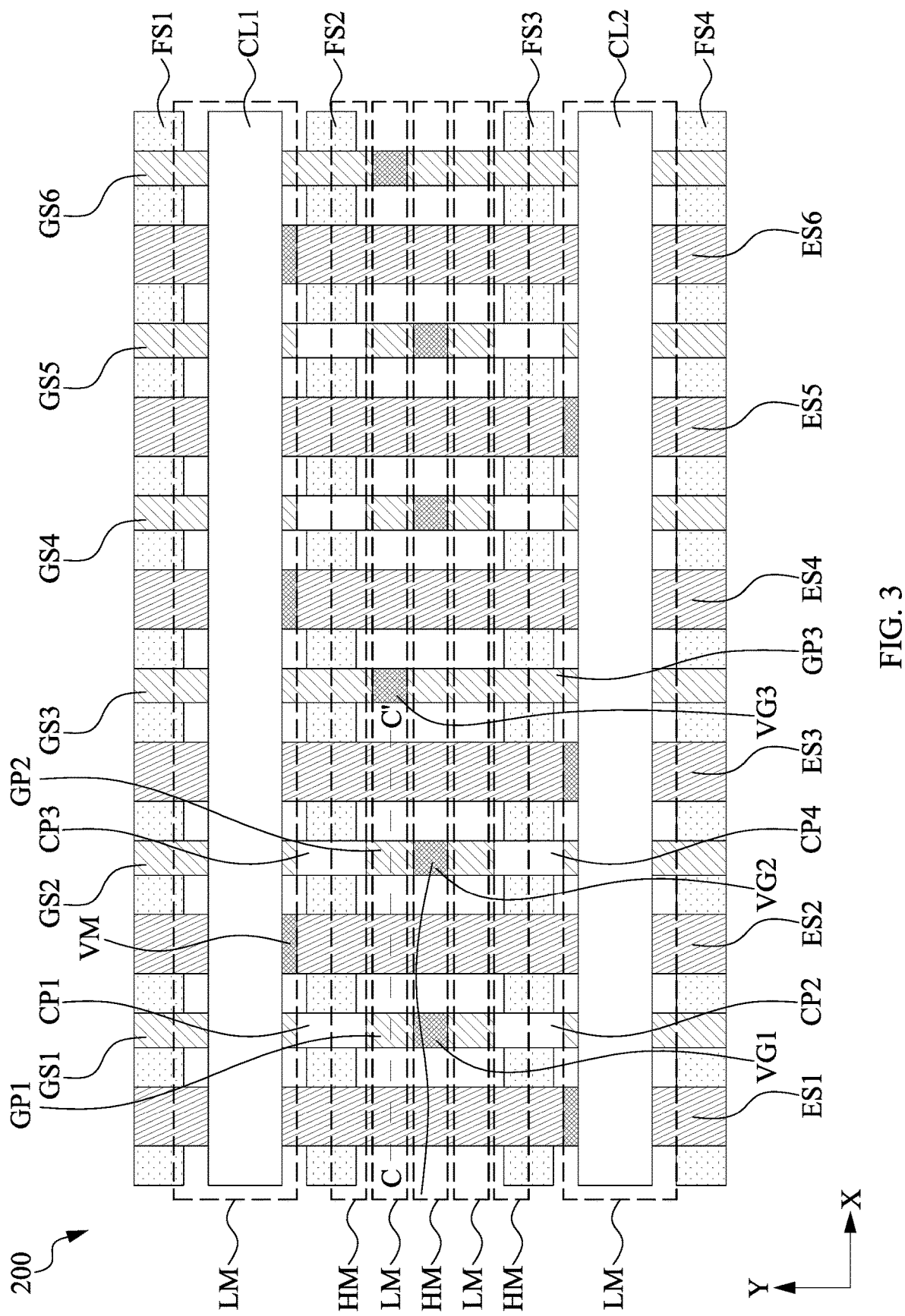
FIG. 3 illustrates a schematic view of a layout of a semiconductor device, in accordance with some embodiments of the present disclosure.

FIG. 3 illustrates a schematic view of a layout of a semiconductor device 200, in accordance with some embodiments of the present disclosure. The semiconductor device 200 may be the same as or similar to the semiconductor device 100, and one of differences is that the semiconductor device 200 further includes a plurality of metal traces LM and HM, gate connectors VG1, VG2 and VG3, and source/drain connectors (S/D connectors) VM.

In some embodiments, as shown in FIG. 3, the plurality of metal traces LM extend along the X direction. The plurality of metal traces LM are spaced apart from each other along the Y direction. In some embodiments, the plurality of metal traces HM extend along the X direction. In some embodiments, the plurality of metal traces HM are spaced apart from each other along the Y direction. The metal traces LM and HM may be arranged alternatively along the Y direction. The metal traces LM and the metal traces HM are disposed over the gates GS1-GS6 and over the electrical conductors ES1-ES6. In some embodiments, each of the metal traces LM is electrically connected to a power supply with low voltage, and each of the metal traces HM is electrically connected to a power supply with high voltage. In some embodiments, the term "metal trace" discussed in the present disclosure is also referred to as "M0."

In some embodiments, the gate connectors VG1-VG3 extend along the Z direction. The gate connectors VG1-VG3 are configured to electrically connect the gates GS1-GS6 to one of the metal traces HM or LM. In some embodiments, the gate connector VG1 is disposed over the gate GS1. In some embodiments, the gate connector VG1 electrically connects the segment GP1 of the gate GS1 to one of the metal traces HM. In some embodiments, the gate connector VG2 is disposed over the gate GS2. In some embodiments, the gate connector VG2 electrically connects the segment GP2 of the gate GS2 to one of the metal trace HM. In some embodiments, the gate connector VG1 is substantially aligned to the gate connector VG2 in the X direction. In some embodiments, the gate connector VG3 is disposed over the gate GS3. The gate connector VG3 electrically connects the segment GP3 of the gate GS3 to one of the metal traces LM. In some embodiments, the gate connector VG3 is misaligned to the gate connector VG1 and the gate connector VG2 in the X direction.

In some embodiments, the S/D connectors VM extends along the Z direction. In some embodiments, the S/D connectors VM are configured to electrically connect the electrical conductors ES1-ES6 to one of the metal traces HM or LM. In some embodiments, the S/D connector VM is disposed over the electrical conductors ES1-ES6 and electrically connects the electrical conductors ES1-ES6 to one of the metal trace LM. In some embodiments, the terms "gate connector" and "S/D connector" discussed in the present disclosure are also referred to as "via".

In a top-down sequence, the metal trace LM or HM is electrically connected through the gate connector (e.g., the gate connectors VG1-VG3) or the S/D connector (e.g., the S/D connector VM) to the gate (e.g., the gates GS1-GS6) or the electrical conductor (e.g., the electrical conductors ES1-ES6), respectively.

Figure 4A:
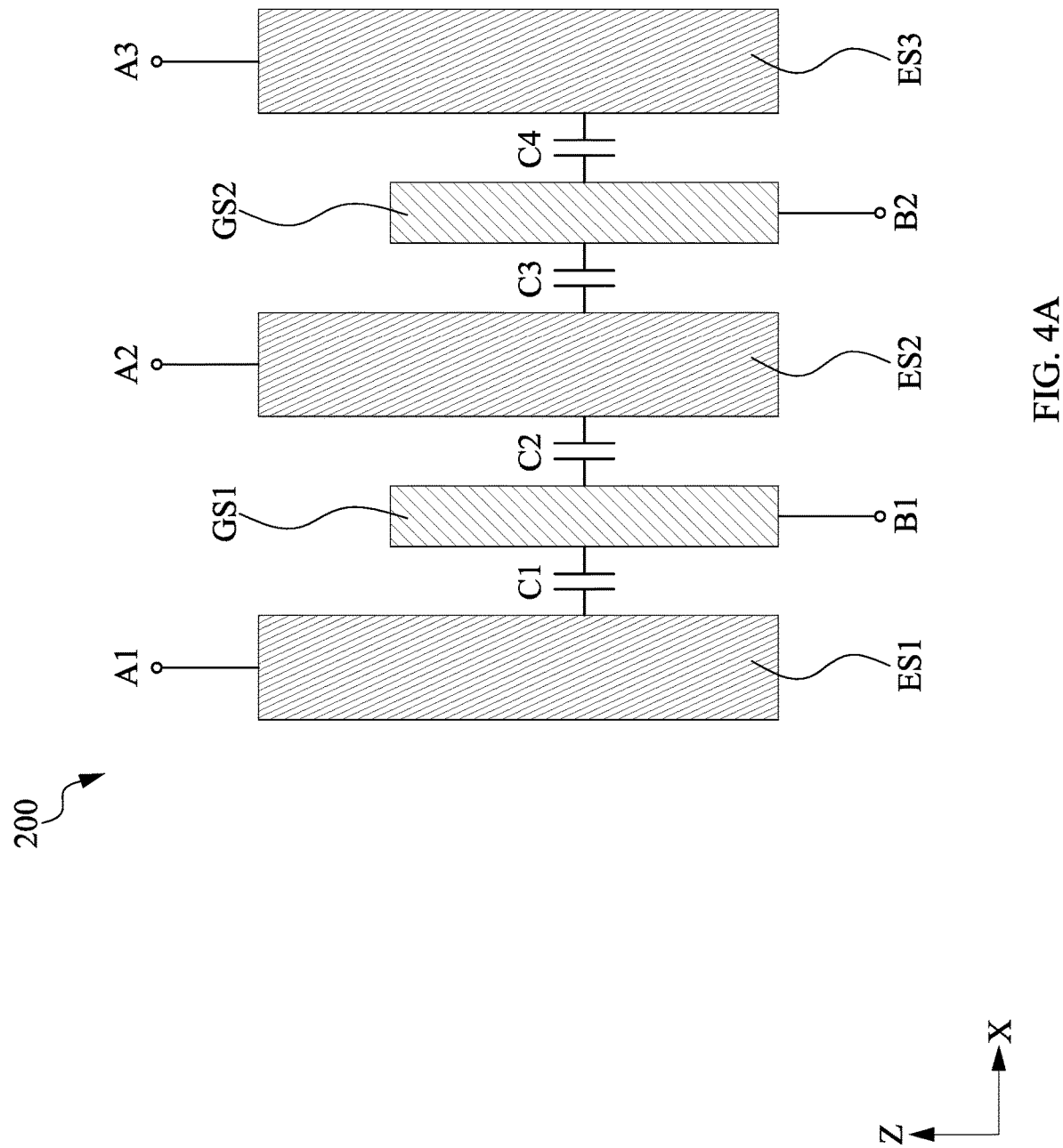
FIG. 4A illustrates a cross-sectional view of a semiconductor device, in accordance with some embodiments of the present disclosure.

FIG. 4A illustrates a cross-sectional view along line C-C' of the semiconductor device 200, in accordance with some embodiments of the present disclosure.

In some embodiments, the gate GS1 and the electrical conductor ES1 are at least partially overlapped in the X direction to form a capacitor C1. In some embodiments, the gate GS1 and the electrical conductor ES2 are at least partially overlapped in the X direction to form a capacitor C2. In some embodiments, the gate GS2 and the electrical conductor ES2 are at least partially overlapped in the X direction to form a capacitor C3. In some embodiments, the gate GS2 and the electrical conductor ES3 are at least partially overlapped in the X direction to form a capacitor C4.

In some embodiments, the capacitors C1, C2, C3 and C4 are formed to be electrically connected in parallel. In some other embodiments, the capacitors C1, C2, C3 and C4 are formed to be electrically connected in series. In alternative embodiments, the capacitors C1, C2, C3 and C4 are formed to be electrically connected in series and parallel combination.

Figure 4B:
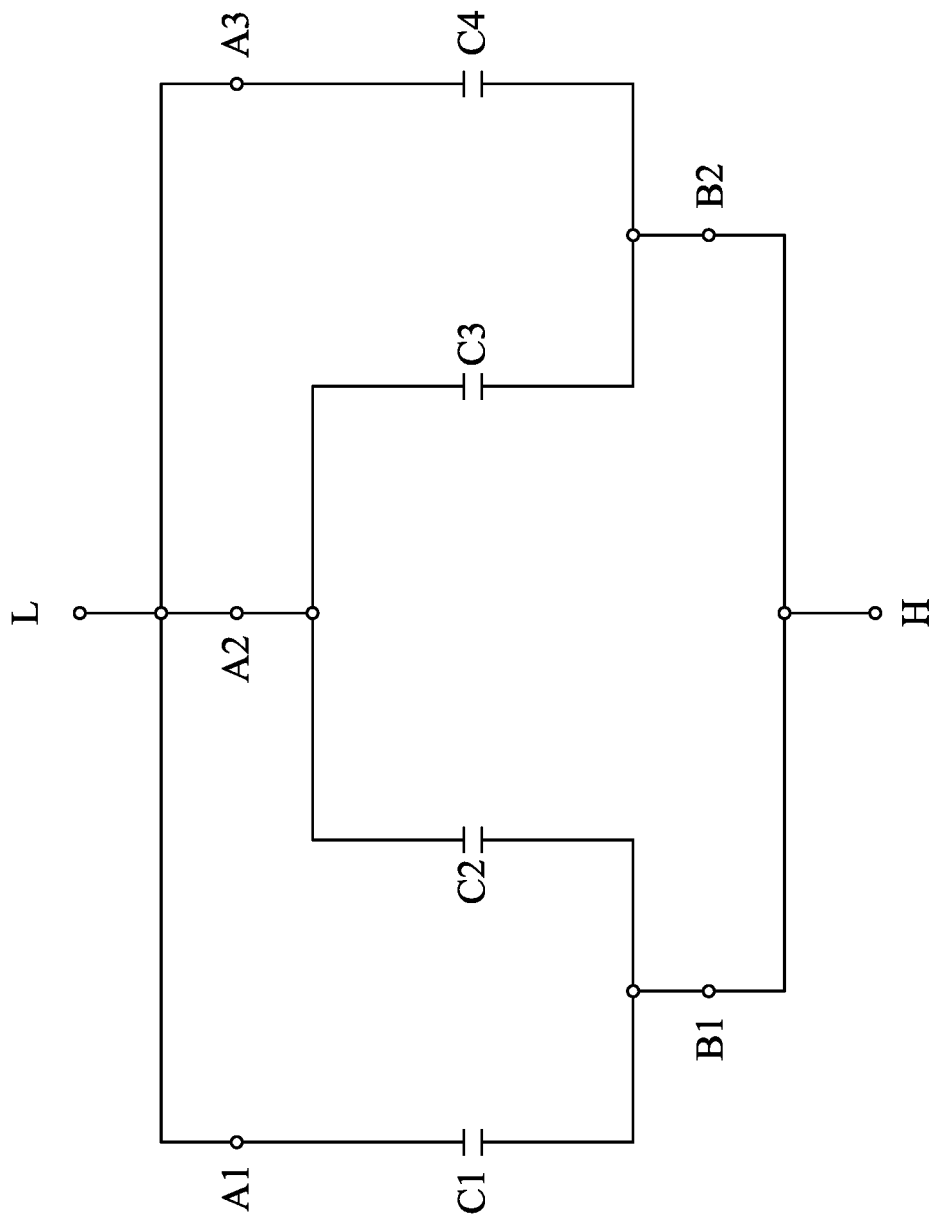
FIG. 4B is a schematic diagram of a circuit including capacitors in FIG. 4A, in accordance with some embodiments of the present disclosure.

FIG. 4B is a schematic diagram of a circuit including capacitors in FIG. 4A, in accordance with some embodiments of the present disclosure. For simplicity of illustration, the capacitors C1-C4 are given for illustration in FIG. 4B. Additional capacitors connected to the capacitors C1-C4 are within the contemplated scope of the present disclosure.

For illustration with reference to FIG. 4B, a first end (or terminal) of the capacitor C1 is electrically connected to a node A1. A second end of the capacitor C1 and a second end of the capacitor C2 are electrically connected to a node B1. A first end of the capacitor C2 and a first end of the capacitor C3 are electrically connected to a node A2. A second end of the capacitor C3 and a second end of the capacitor C4 are electrically connected to a node B2. A first end of the capacitor C4 is electrically connected to a node A3.

As described above with reference to FIG. 3, each of the gate GS1 and the gate GS2 are electrically connected to the metal trace HM, respectively. In such embodiments, the nodes B1 and B2 are electrically connected with each other. In some embodiments, the nodes B1 and B2 are electrically connected to a power supply H with high voltage. As described above with reference to FIG. 3, each of the electrical conductors ES1, ES2 and ES3 are electrically connected to the metal trace LM, respectively. In such embodiments, the nodes A1, A2 and A3 are electrically connected with each other. In some embodiments, the nodes A1, A2 and A3 are electrically connected to a power supply L with low voltage. As a result, the capacitors C1-C4 are electrically connected in parallel.

The connections and/or configurations discussed above are given for illustrative purposes. Various connections and/or configurations of the gates GS1-GS6 and the electrical conductors ES1-ES6 are within the contemplated scope of the present disclosure. For example, the gates GS1 and GS2 may be electrically connected to a power supply with low voltage, while the electrical conductors ES1, ES2 and ES3 may be electrically connected to a power supply with high voltage. In some embodiments, the active regions FS1-FS4 are doped with n-type dopant(s) to form NODs. In such embodiments, each of the segment GP1 of the gate GS1 and the segment GP2 of the gate GS2 may be electrically connected to a power supply with high voltage, while each of the electrical conductors ES1, ES2 and ES3 may be electrically connected to a power supply with low voltage. In some embodiments, the active regions FS1-FS4 are doped with p-type dopant(s) to form PODs. In such embodiments, each of the segment GP1 of the gate GS1 and the segment GP2 of the gate GS2 may be electrically connected to a power supply with low voltage, while each of the electrical conductors ES1, ES2 and ES3 may be electrically connected to a power supply with high voltage.

In various embodiments, the electrical conductor ES1 is electrically disconnected from the electrical conductor ES2 and electrical conductor ES3, and the gates GS1 and GS2 are electrically connected with each other. In such embodiments, the node A1 is configured to receive a voltage different from the voltage of the nodes A2 and A3, and the nodes B1-B2 are configured to receive the same voltage. Equivalently, the capacitors C2-C4 are electrically connected in parallel, and the capacitor C1 is electrically connected in series with the parallel connection of the capacitors C2-C4. Accordingly, with various connections and/or configurations of the electrical conductors ES1-ES6 and the gates GS1-GS6, the capacitors C1-C4 may be connected in series, in parallel, or in series and parallel combination.

In a comparative example, the separated segments of the gates, used to form capacitors, are formed by only forming the CPOs. The CPOs may extend across all the POs and MDs to cut them, and the via(s) cannot formed directly above the CPOs, which results in influencing the layout of via(s). When the manufacturing process shrinks (e.g., from 10-nm-scale to 5-nm-scale or less), it is difficult to achieve higher capacitor capacitance density by only forming the CPOs. In this disclosure, a portion of the gates is replaced by the CPODE. The CPODE is disposed on the active regions and disconnects the gate on the STI from the active regions without cutting the MD. Therefore, it has a relatively less influence on the layout of the via(s). As a result, the semiconductor device can have a higher capacitor capacitance density with smaller cell height.

Figure 5A:
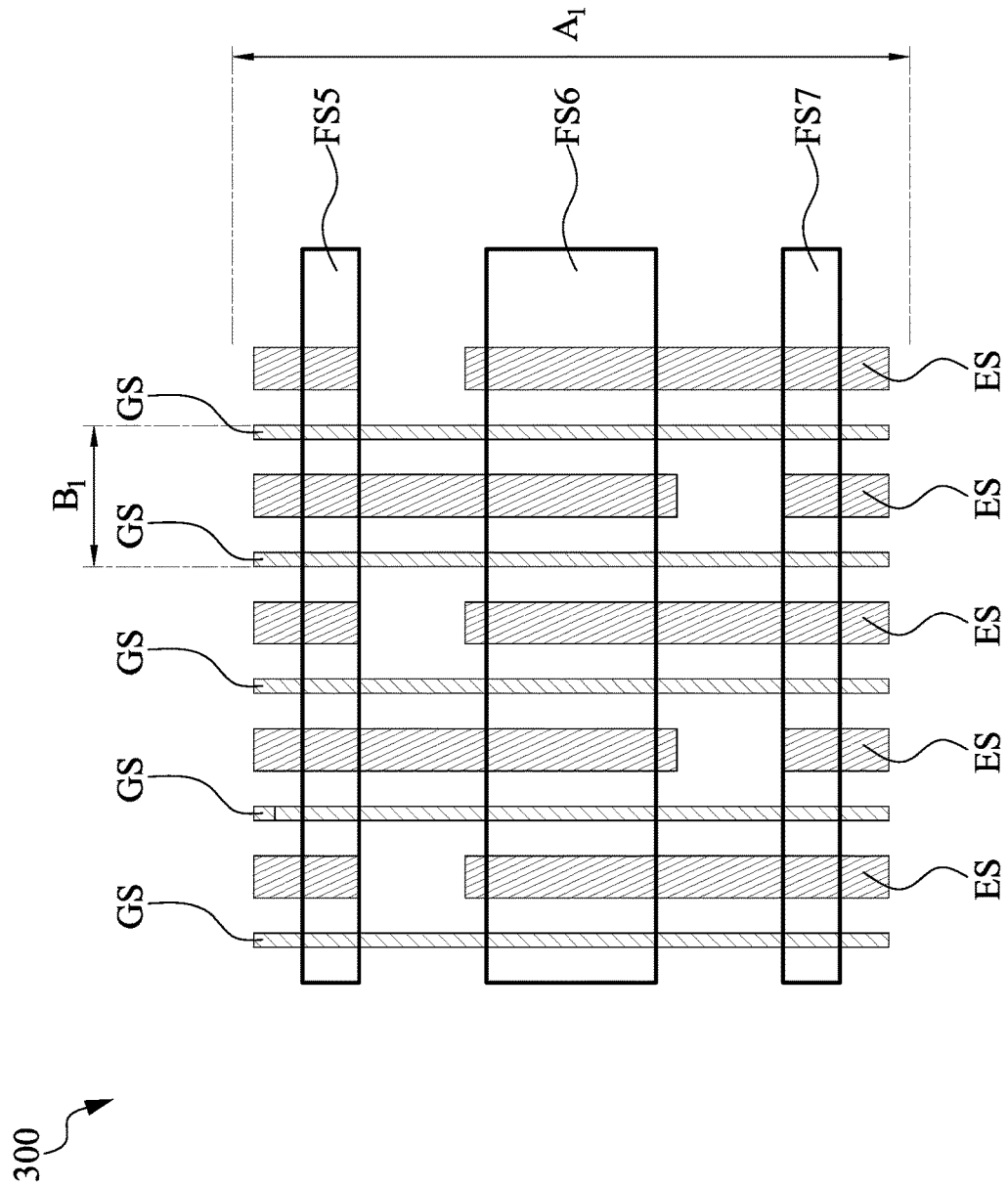
FIG. 5A illustrates a schematic view of a layout of a semiconductor device, in accordance with some embodiments of the present disclosure.
Figure 5B:
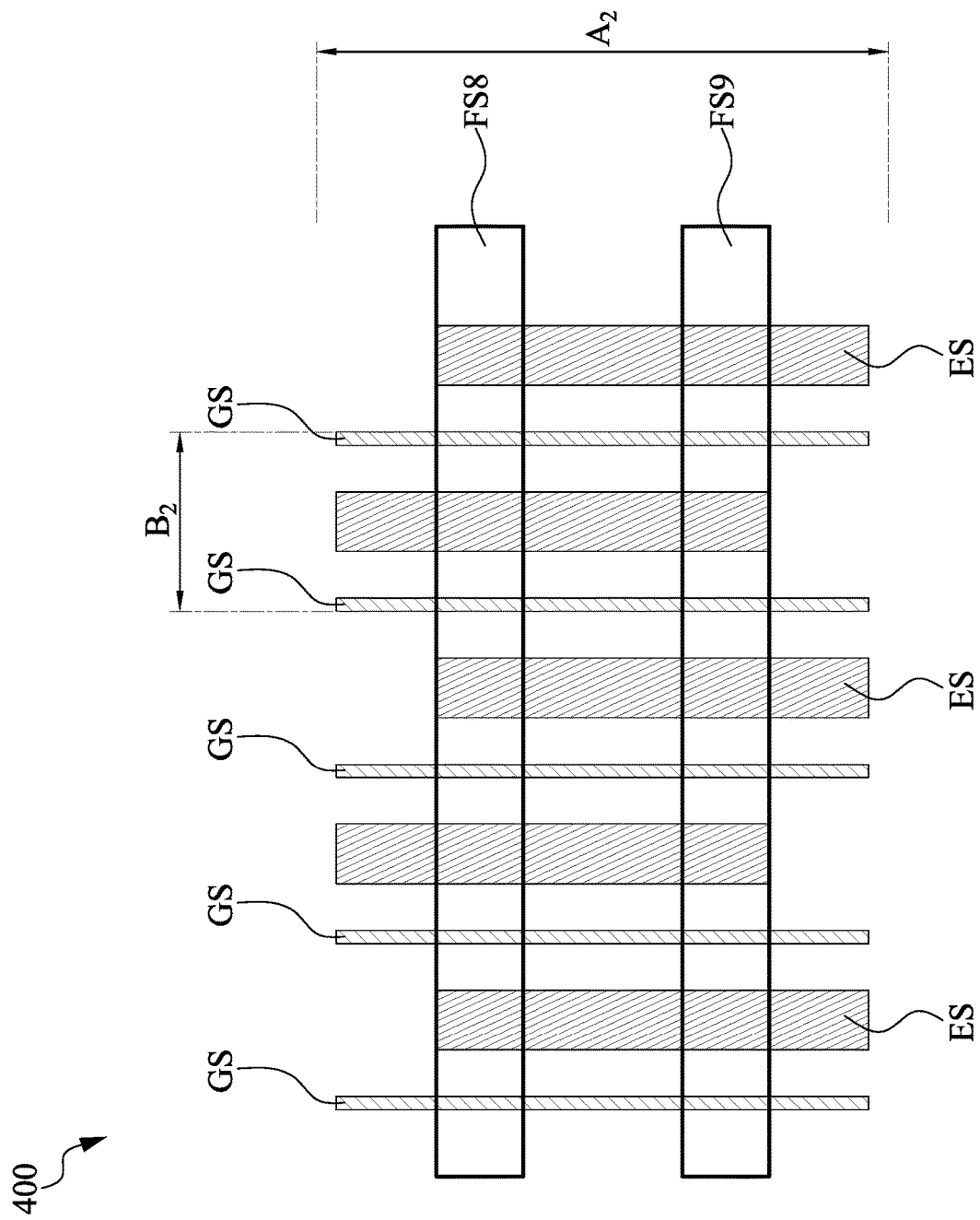
FIG. 5B illustrates a schematic view of a layout of a semiconductor device, in accordance with some embodiments of the present disclosure.

This disclosure may applicable to semiconductor device with a relatively cell height. FIGS. 5A and 5B illustrate exemplary design rules to which the embodiments of this disclosure are applicable. However, the scope of the disclosure is not intended to be limiting. To briefly illustrate design rules of the embodiments, some elements and/or features, such as the CPODE and the CPO, are omitted.

FIG. 5A illustrates a schematic view of a layout of a semiconductor device 300, in accordance with some embodiments of the present disclosure.

The semiconductor device 300 may include three active regions FS5, FS6 and FS7. In some embodiments, the size (or dimension) of the active region FS6 is greater than that of the active regions FS5 and FS7, and the size (or dimension) of the active region FS5 is substantially equal to that of the active region FS7. The semiconductor device 300 also includes a plurality of gates GS and a plurality of electrical conductors ES across the active regions FS5-FS7. In some embodiments, one cell of the semiconductor device 300 may include three active regions FS5-FS7. In such embodiments, the cell height $A_1$ of the semiconductor device 300 ranges from about 10 nm to about 400 nm. In some embodiments, the poly pitch $B_1$, which may be defined as a pitch between two adjacent gates GS, ranges from about 20 nm to about 100 nm.

FIG. 5B illustrates a schematic view of a layout of a semiconductor device 400, in accordance with some embodiments of the present disclosure.

The semiconductor device 400 may include two active regions FS8 and FS9. In some embodiments, the size (or dimension) of the active region FS8 is substantially equal to that of the active region FS9. In some embodiments, one cell of the semiconductor device 400 may include two active regions FS8 and FS9. In such embodiments, the cell height A2 of the semiconductor device 400 ranges from about 10 nm to about 400 nm. In some embodiments, the poly pitch B2 ranges from about 20 nm to about 100 nm.

Further, the semiconductor devices 100-400 can share the same design rules, such as cell height, M0 mask and/or poly pitch, as those of a standard cell. Thus, the higher capacitor capacitance density of the semiconductor devices 100-400 is able to be implemented.

Figure 6:
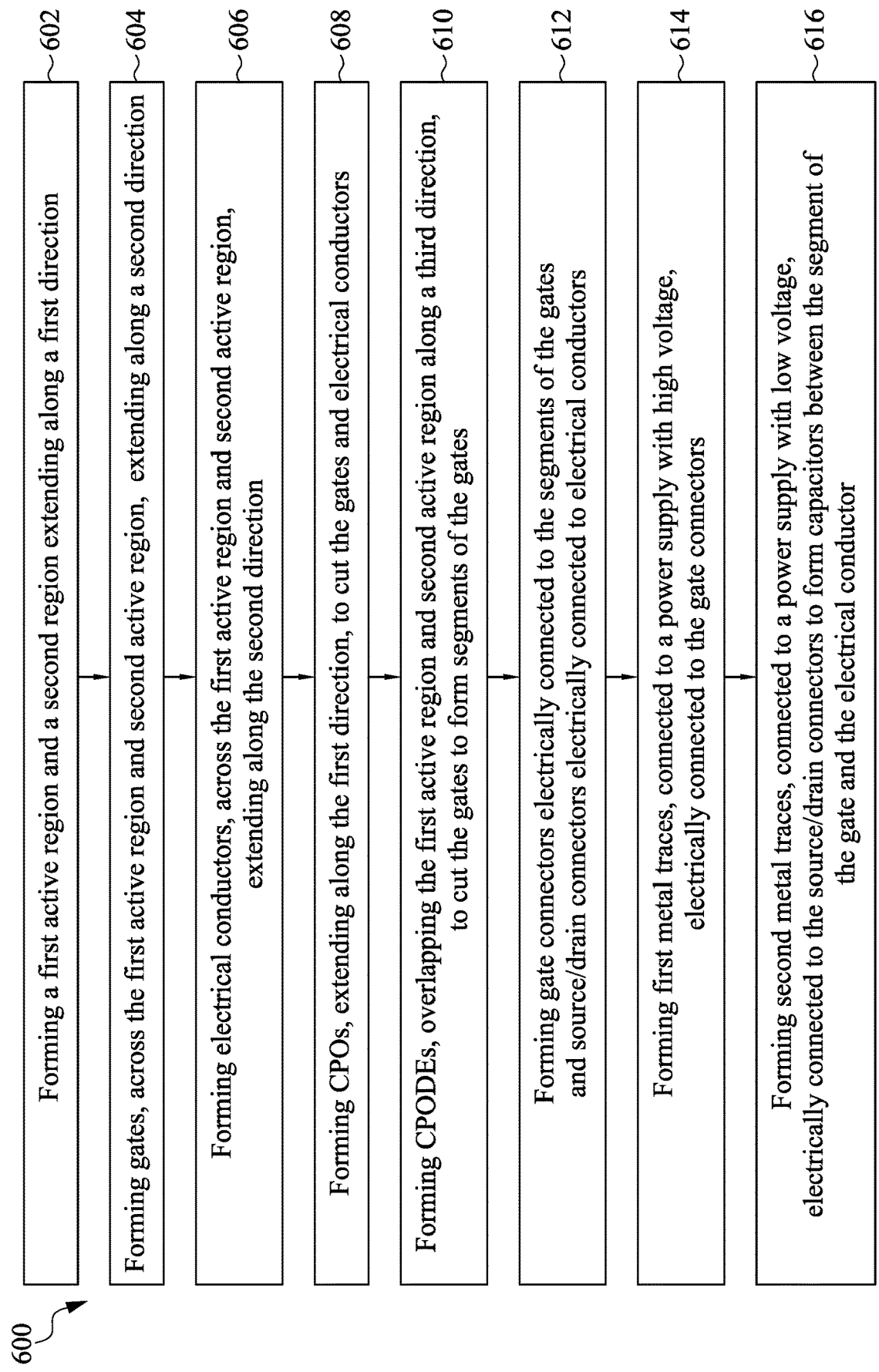
FIG. 6 is a flow chart illustrating a method for manufacturing a semiconductor device according to various aspects of the present disclosure.

FIG. 6 is a flow chart illustrating a method 600 for manufacturing a semiconductor device according to various aspects of the present disclosure.

The method 600 begins with operation 602 in which a first active region and a second region, extending along a first direction, are formed. For example, the operation 602 may include forming the active regions FS2 and FS3 as shown in FIG. 3.

The method 600 continues with operation 604 in which gates, across the first active region and second active region and extending along a second direction, are formed. For example, the operation 604 may include forming the gates GS1-GS6 as shown in FIG. 3.

The method 600 continues with operation 606 in which electrical conductors, across the first active region and second active region and extending along the second direction, are formed. For example, the operation 606 may include forming the electrical conductors ES1-ES6 as shown in FIG. 3.

The method 600 continues with operation 608 in which CPOs, extending along the first direction, are formed to cut the gates and electrical conductors. For example, the operation 608 may include forming cutting structures CL1 and CL2 to cut the gates GS1-GS6 and electrical conductors ES1-ES6 as shown in FIG. 3.

The method 600 continues with operation 610 in which CPODEs, overlapping the first active region and second active region along a third direction, are formed to cut the gates to form segments of the gates. For example, the operation 610 may include forming the gaps CP1-CP4, and the dielectric layer 152 is filled in the gaps CP1-CP4 to form CPODEs. Further, the segments GP1 and GP2 are formed as shown in FIG. 3.

The method 600 continues with operation 612 in which gate connectors, electrically connected to the segments of the gates, and source/drain connectors, electrically connected to electrical conductors, are formed. For example, the operation 612 may include forming the gate connector VG1 on the segment GP1 and gate connector VG2 on the segment GP2. The operation 612 may also include forming source/drain connectors VM on the electrical conductors ES1-ES6.

The method 600 continues with operation 614 in which first metal traces, connected to a power supply with high voltage and electrically connected to the gate connectors, are formed. For example, the operation 614 may include forming metal traces HM electrically connected to the gate connectors VG1 and VG2 as shown in FIG. 3.

The method 600 continues with operation 616 in which second metal traces, connected to a power supply with low voltage and electrically connected to the source/drain connectors, are formed to form capacitors between the segment of the gate and the electrical conductor. For example, the operation 616 may include forming metal traces LM electrically connected to the source/drain connectors VM as shown in FIG. 3. As a result, the capacitors C1-C4 are formed between the segments of the gates GS1, GS2 and the electrical conductors ES1-ES3 as shown in FIG. 4A.

The method 600 is merely an example, and is not intended to limit the present disclosure beyond what is explicitly recited in the claims. Additional operations can be provided before, during, and after the method 300, and some operations described can be replaced, eliminated, or moved around for additional embodiments of the method.

Some embodiments of the present disclosure provide a semiconductor device. The semiconductor device includes a first active region extending along a first direction. The semiconductor device also includes a second active region extending along the first direction. The semiconductor device further includes a first gate extending along a second direction perpendicular to the first direction. The first gate has a first segment disposed between the first active region and the second active region. Besides, the semiconductor device includes a first electrical conductor extending along the second direction and across the first active region and the second active region, wherein the first segment of the first gate and the first electrical conductor are partially overlapped to form a first capacitor.

Some embodiments of the present disclosure provide a semiconductor device. The semiconductor device includes a first active region extending along a first direction. The semiconductor device also includes a first gate extending along a second direction perpendicular to the first direction. The first gate defines a first gap overlapping the first active region in a third direction substantially perpendicular to the first direction and the second direction.

Some embodiments of the present disclosure provide a method of manufacturing a semiconductor device. The method includes: forming a first active region extending along a first direction; forming a second active region extending along the first direction; forming a first gate extending along a second direction perpendicular to the first direction, wherein the first gate has a first segment disposed between the first active region and the second active region; and forming a first electrical conductor extending along the second direction and across the first active region and the second active region, wherein the first segment of the first gate and the first electrical conductor are partially overlapped to form a first capacitor.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first active region extending along a first direction;
   a second active region extending along the first direction;
   a first gate extending along a second direction perpendicular to the first direction, wherein the first gate has a first segment disposed between the first active region and the second active region; and
   a first electrical conductor extending along the second direction and across the first active region and the second active region, wherein the first segment of the first gate and the first electrical conductor are partially overlapped along the first direction to form a first capacitor,
   wherein the first segment of the first gate has a first length along the second direction, the first electrical conductor has a second length between the first active region and the second active region along the second direction, and the second length is greater than the first length,
   and wherein the first gate is free from overlapping the first active region and the second active region in a third direction substantially perpendicular to the first direction and the second direction.

2. The semiconductor device of claim 1, further comprising:
   a second gate extending along the second direction, wherein the second gate has a second segment disposed between the first active region and the second active region, and the second segment of the second gate and the first electrical conductor are partially overlapped along the first direction to form a second capacitor connected with the first capacitor in parallel.

3. The semiconductor device of claim 2, further comprising:
   a first gate connector electrically connected to the first gate and disposed between the first active region and the second active region; and
   a second gate connector electrically connected to the second gate, wherein the first gate connector is aligned to the second gate connector.

4. The semiconductor device of claim 2, further comprising:
   a third gate extending along the second direction, wherein the third gate overlaps the first active region in the third direction.

5. The semiconductor device of claim 4, wherein the third gate overlaps the second active region in the third direction.

6. The semiconductor device of claim 4, wherein the third gate has a third length between the first active region and the second active region along the second direction, and the third length is greater than the first length.

7. The semiconductor device of claim 2, further comprising:
   a cutting structure extending along the first direction, wherein the cutting structure cuts the first gate and the second gate.

8. The semiconductor device of claim 7, wherein the cutting structure further cuts the first electrical conductor.

9. The semiconductor device of claim 1, wherein the first electrical conductor extends continuously between the first active region and the second active region, and overlaps the first active region and the second active region in the third direction substantially perpendicular to the first direction and the second direction.

10. A semiconductor device, comprising:
   a first active region extending along a first direction;
   a first gate extending along a second direction perpendicular to the first direction, wherein the first gate defines a first gap overlapping the first active region in a third direction substantially perpendicular to the first direction and the second direction;
   a second active region extending along the first direction, wherein the first gate defines a second gap overlapping the second active region in the third direction,
   wherein the first gate comprises a continuous segment disposed between the first active region and the second active region, and the continuous segment of the first gate has a first length less than a distance between the first active region and the second active region along the second direction; and
   a first electrical conductor extending along the second direction, wherein the first gate and the first electrical conductor are partially overlapped along the first direction to form a first capacitor.

11. The semiconductor device of claim 10, wherein the first gate is free from overlapping the first active region in the third direction.

12. The semiconductor device of claim 10, further comprising:
   a first gate connector electrically connected to the first gate, wherein the first gate connector is disposed between the first active region and the second active region.

13. The semiconductor device of claim 10, further comprising:
   a second gate extending along the second direction, wherein the second gate defines a third gap substantially aligned to the first gap.

14. The semiconductor device of claim 13, wherein the second gate and the first electrical conductor are partially overlapped along the first direction to form a second capacitor, and the first capacitor and the second capacitor are connected in parallel.

15. The semiconductor device of claim 13, further comprising:
   a third active region extending along the first direction, wherein the first gate overlaps the third active region, and the second gate overlaps the third active region in the third direction.

16. The semiconductor device of claim 15, further comprising:
   a cutting structure extending along the first direction and disposed between the first active region and the third active region, wherein the cutting structure cuts the first gate, the second gate and the first electrical conductor.

17. The semiconductor device of claim 15, wherein the first active region comprises a first fin with a first thickness, the third active region comprises a second fin with a second thickness greater than the first thickness.

18. The semiconductor device of claim 10, wherein the first active region comprises a first fin having a second length along the second direction, the first gap has a third length along the second direction, and the second length is less than the third length.

19. A method of manufacturing a semiconductor device, comprising:
   forming a first active region extending along a first direction;
   forming a second active region extending along the first direction;
   forming a first gate extending along a second direction perpendicular to the first direction, wherein the first gate has a first segment disposed between the first active region and the second active region;
   forming a first electrical conductor extending along the second direction and across the first active region and the second active region, wherein the first segment of the first gate and the first electrical conductor are partially overlapped along the first direction to form a first capacitor;
   forming a first gap on the first gate, wherein the first gap overlaps the first active region in a third direction substantially perpendicular to the first direction and the second direction; and
   forming a second gap on the first gate to form the first segment of the first gate, wherein the second gap overlaps the second active region in the third direction.

20. The method of claim 19, further comprising:
   forming a second gate extending along the second direction, wherein the second gate has a second segment disposed between the first active region and the second active region, and the second segment of the second gate and the first electrical conductor are partially overlapped in the first direction to form a second capacitor connected with the first capacitor in parallel.

* * * * *